United States Patent [19]

Bush

[11] Patent Number: 4,972,138
[45] Date of Patent: Nov. 20, 1990

[54] OSCILLOSCOPE-LIKE USER-INTERFACE FOR A LOGIC ANALYZER

[75] Inventor: Kevin M. Bush, Colorado Springs, Colo.

[73] Assignee: Hewlett Packard Co., Palo Alto, Calif.

[21] Appl. No.: 449,463

[22] Filed: Dec. 12, 1989

Related U.S. Application Data

[63] Continuation of Ser. No. 49,645, May 11, 1987, abandoned.

[51] Int. Cl.[5] .......................... G06F 3/14; G01R 21/28
[52] U.S. Cl. ............................... 324/73.1; 324/121 R; 324/158 R; 364/487
[58] Field of Search ............ 324/121 R, 83 D, 158 R, 324/73.1; 364/487; 340/723, 726, 721, 722; 371/17, 19

[56] References Cited

U.S. PATENT DOCUMENTS

| | | | |
|---|---|---|---|
| 4,040,025 | 8/1977 | Morrill, Jr. et al. | 340/803 X |
| 4,373,193 | 2/1983 | Haag et al. | 364/900 X |
| 4,425,643 | 1/1984 | Chapman et al. | 324/73 R X |
| 4,455,624 | 6/1984 | Haag et al. | 364/900 |
| 4,561,049 | 12/1985 | Deleganes et al. | 340/723 |
| 4,574,354 | 3/1986 | Mihalik et al. | 324/73 R |
| 4,585,975 | 4/1986 | Wimmer | 324/73 AT |
| 4,611,281 | 9/1986 | Suko et al. | 371/16 X |
| 4,639,940 | 1/1987 | Goodwin, Jr. | 371/19 X |
| 4,821,030 | 4/1989 | Batson et al. | 324/121 R |

OTHER PUBLICATIONS

Tektronix; "556 Dual Beam Oscilloscope"; 1971; pp. 137–139.

Hewlett–Packard Company Logic Analyzer Operating and Programming Manual—1630 A/D/G and 1631 A/D; (1984).

Primary Examiner—Ernest F. Karlsen
Assistant Examiner—Vinh P. Nguyen
Attorney, Agent, or Firm—Christopher J. Byrne

[57] ABSTRACT

Provided is an oscilloscope-like user-interface for a logic analyzer. The oscilloscope-like user-interface simplifies user control of the logic analyzer. The oscilloscope-like user-interface substitutes two oscilloscope-like controls (seconds-per-division and delay) for six logic analyzer controls (sample-period, magnification, magnify-about, magnify-about marker-movement, start-/center/end, and delay-from-trigger). The result of the substitution is a logic analyzer which is operable with oscilloscope-like controls and which does not require user understanding of the logic analyzer's sampling hardware for effective user operation.

2 Claims, 16 Drawing Sheets

OSCILLOSCOPE-LIKE USER-INTERFACE FOR A LOGIC ANALYZER

CROSS REFERENCE TO RELATED APPLICATION

This application is a continuation of Ser. No. May 11, 1987 now abandoned.

BACKGROUND OF THE INVENTION

An oscilloscope is an electronic instrument which is used to detect, analyze and display voltage signals. A logic analyzer is an electronic instrument used to detect, analyze and display digital voltage signals. (Generally, digital voltage signals may be regarded as a sub-set of voltage signals. Typically, a digital voltage signal conveys binary information, that is, the signal is either logic "high" or logic "low". For instance, signal voltage is above a according to one convention, if the given threshold voltage value it is "high" whereas if it is below the threshold value it is "low". In conventional binary logic, "high" represents a "1" and "low" represents a "0".) Both instruments acquire input signals and display their representative waveforms. The instruments' display screens are essentially windows through which users can view acquired signal waveforms.

The oscilloscope displays an input voltage signal's waveform as a function of voltage-versus-time, typically with voltage amplitude measured along a vertical axis and time measured along a horizontal axis. Like an oscilloscope, the logic analyzer also displays a digital signal's waveform as a function of voltage-versus-time with voltage amplitude measured along a vertical axis and time displayed along a horizontal axis. Unlike an oscilloscope, however, the logic analyzer does not display high vertical (that is, voltage) resolution. Rather, for a given signal the logic analyzer waveform will resemble a square-wave and therefore be either "high" or "low". Since the signal carries binary information, that is, 1's and 0's, it is the signal's transition above or below the threshold value, rather than its absolute value, that is important. Therefore, the logic analyzer's square-wave waveform display mode is both adequate and ideal for digital signals.

Certainly, the oscilloscope, as opposed to the logic analyzer, is the more general purpose instrument and most engineers, particularly electrical engineers, are familiar with its function and operation. The operational user-interface for the oscilloscope comprises two major controls: seconds-per-division, also known as range, and delay. Typically, the display screen of an oscilloscope is divided into equal size divisions along both the voltage amplitude and the time axes. The seconds-per-division control allows the user to change the amount of time displayed across the time axis of the display screen. The total time across the screen is known as the range. For any given display, decreasing seconds-per-division increases display resolution in a manner analogous to increasing the magnification of a microscope. The delay control positions the display window in time relative to the trigger event. The trigger defines the conditions which the input signal must meet before it is acquired by the instrument. By adjusting the oscilloscope's delay, the user can move the waveform display window forward or back in time relative to the trigger.

The function and operation of the logic analyzer, however, is not as familiar to most engineers. Typically, the logic analyzer displays the digital waveforms of many individual digital signals at once, such as the signals on the multiple lines of a data-bus or an address-bus. The logic analyzer samples an input signal, digitizes the samples, stores the digitized samples in memory and maps the stored digital values into a representative square-wave waveform on the display screen. The typical logic analyzer can show sixteen digital waveforms at once. Thus, on such an analyzer the signals on the sixteen lines of a 16-bit address bus would be shown as sixteen individual square-wave waveforms positioned from the top to the bottom of the display screen. The user of the logic analyzer can then view the sixteen waveforms simultaneously in a single display. Typically, the user is interested in visually comparing the transitions from high to low of numerous waveforms, such as a comparison of the transitions on certain address lines of a microprocessor with the transitions on certain control lines.

The major operational user-interface controls for a logic analyzer are: sample-period, magnification, magnify-about, magnify-about marker-movement, start-/center/end, and hardware-delay. The sample-period control allows the user to set the sample period of the sampling circuit which acquires and digitizes samples of the input signal. The magnification control allows the user to select various magnifications of the display window. The magnify-about control allows the user to select one of two markers (usually an "x" and an "o") located in the display window; magnification can only occur about the location of a magnify-about marker. The magnify-about marker-movement control allows the user to position magnify-about markers in the display window. The start/center/end control allows the user to define where, in the digitized samples that are stored in memory, the trigger condition is located. (Similar to an oscilloscope trigger, the logic analyzer trigger defines a condition which the input signal(s) must meet before the instrument begins acquiring samples of input signal(s). The logic analyzer user can define the trigger using so-called edge, pattern and glitch controls.) Finally, the hardware-delay control allows the user to specify a certain delay time from trigger that the sample acquisition hardware will wait before acquiring samples. These typical logic analyzer operational controls are fully explained in the Hewlett-Packard 1984 Operating and Programming Manual for the Model 1630A/D/G Logic Analyzer. These logic analyzer controls give the user much control but they also require a certain degree of understanding of the logic analyzer's sampling hardware function and the schemes for storage of digitized samples in memory. The relatively large number of controls therefore can make the logic analyzer seem confusing to a person who is familiar with the oscilloscope.

SUMMARY OF THE INVENTION

The present invention significantly simplifies user control of the logic analyzer with a new oscilloscope-like user-interface. The oscilloscope-like user-interface substitutes two oscilloscope-like controls (seconds-per-division and delay) for the six logic analyzer controls (sample-period, magnification, magnify-about, magnify-about marker-movement, start/center/end, and hardware-delay). The sample-period and magnification user controls are replaced with one seconds-per-division user control. The magnify-about, magnify-about marker-movement, start/center/end and hardware-delay user controls are replaced with one delay user control. The present invention uses software to automatically adjust sample-period and magnification (in a manner invisible to the user) when the user adjust seconds-per-division. Likewise, start/center/end and hardware-delay are automatically and invisibly adjusted by software when the user adjusts delay. Finally, the magnify-about and magnify-about marker-movement controls are essentially eliminated because magnification is automatically adjusted via seconds-per-division.

DESCRIPTION OF THE PREFERRED EMBODIMENT

Figure 1:
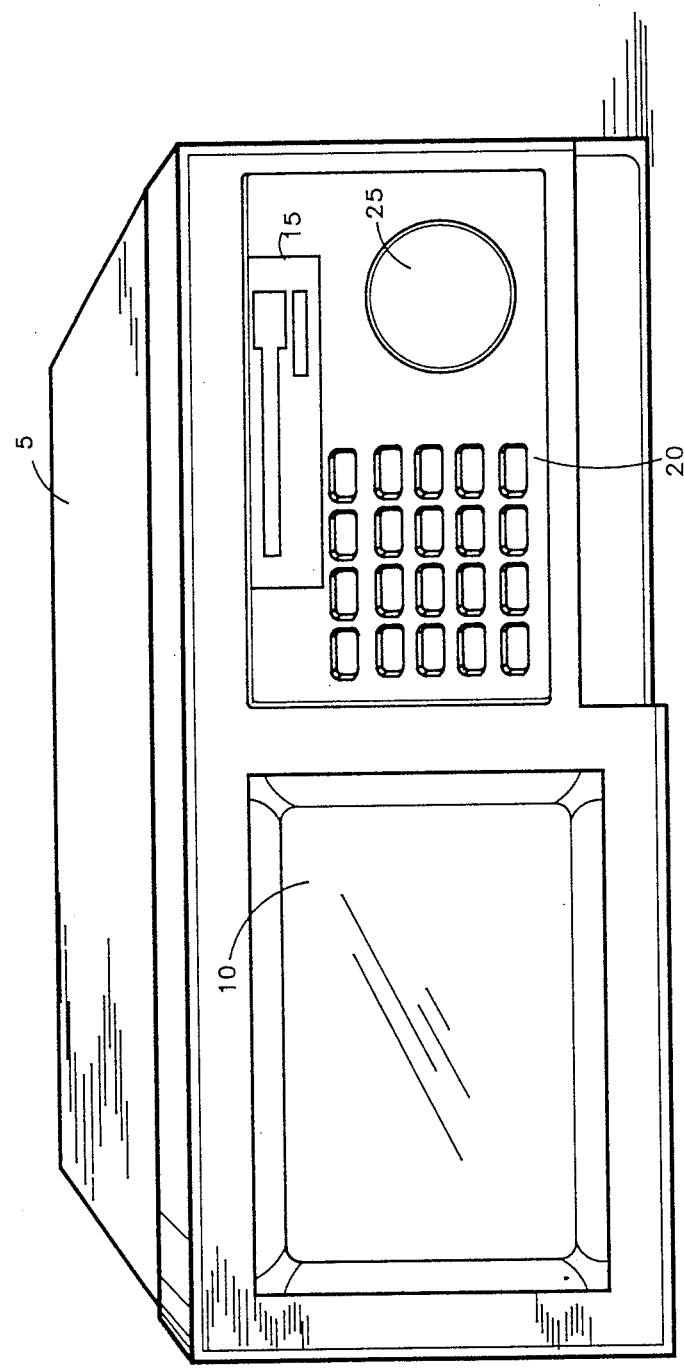
FIG. 1 shows a frontal view of a logic analyzer such as would be used with the present invention.

FIG. 1 shows a frontal view of a logic analyzer 5, such as would be used with the present invention. Logic analyzer 5 is user-controlled with keyboard 20 and control knob 25. The user may select various control menus with keyboard 20. The user can roll through various options within the menus by turning knob 25. Disc drive 15 is available for loading and storing software. Digital signal square-wave waveforms are displayed on cathode ray tube (CRT) display screen 10.

Figure 2:
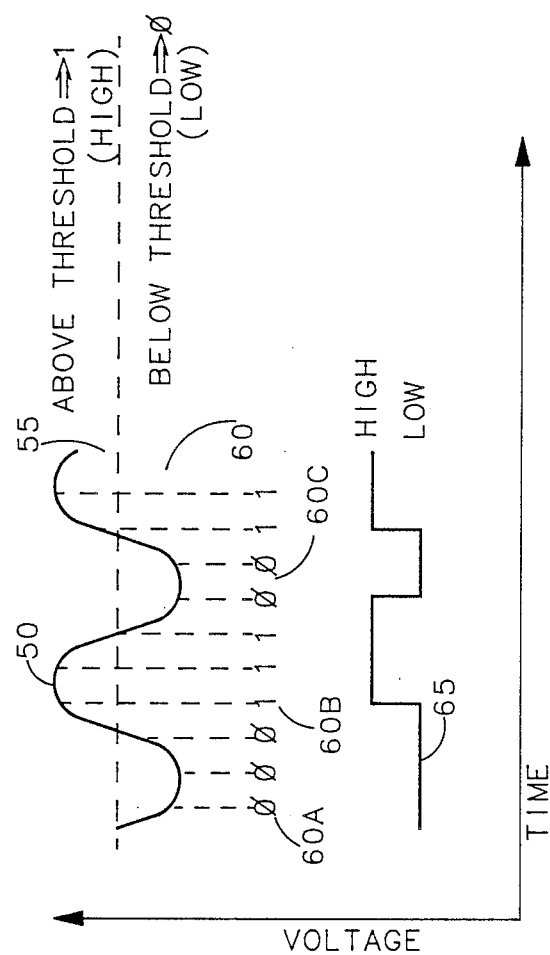
FIG. 2 shows how an input signal is digitized and the digital information converted into a square-wave like waveform.

FIG. 2 shows how a signal 50 is converted into a square-wave like waveform 65. Signal 50 is a voltage signal having a changing voltage amplitude. Given an arbitrary voltage threshold level 55, signal 50 may be regarded as being either above or below threshold level 55 at any given time. Signal 50 may then be sampled at discrete time intervals 60. At each sampling interval, signal 50 will either be above or below threshold level 55. Convention dictates that when the signal 50 sample value is below threshold level 55, that sample is considered to be logic low, that is, 0. Likewise, when the signal 50 sample value is above threshold level 55, that sample is considered to be logic high, that is, 1. Signal 50 sample values may then be converted into binary logic 1's and 0's. For instance, at sample interval 60A, signal 50 is below threshold level 55 so that sample 60A is a 0. At sample interval 60B, signal 50 is above threshold level 55 so that sample 60B is a 1. Likewise, at sample interval 60C, signal 50 is again below threshold level 55 so that sample 60C is a 0. Finally, square-wave waveform 65 may be constructed from the time-ordered sequence 60 of 0's and 1's generated from sampling signal 50. As can be seen from FIG. 3, square-wave waveform 65 is high when signal 50 is above threshold level 55, that is, when the sample values 60 are 1's. Likewise, square-wave waveform 65 is low when signal 50 is below threshold level 55, that is, when the sample values 60 are 0's. Digitizing a signal, that is, converting a changing voltage signal to 1's and 0's based upon whether the signal is above or below a given threshold, allows for representing the signal as a square-wave, such as representing signal 50 with square-wave 65. Moreover, the digitized values, that is the 1's and 0's, may be easily stored and manipulated in memory.

Figure 3:
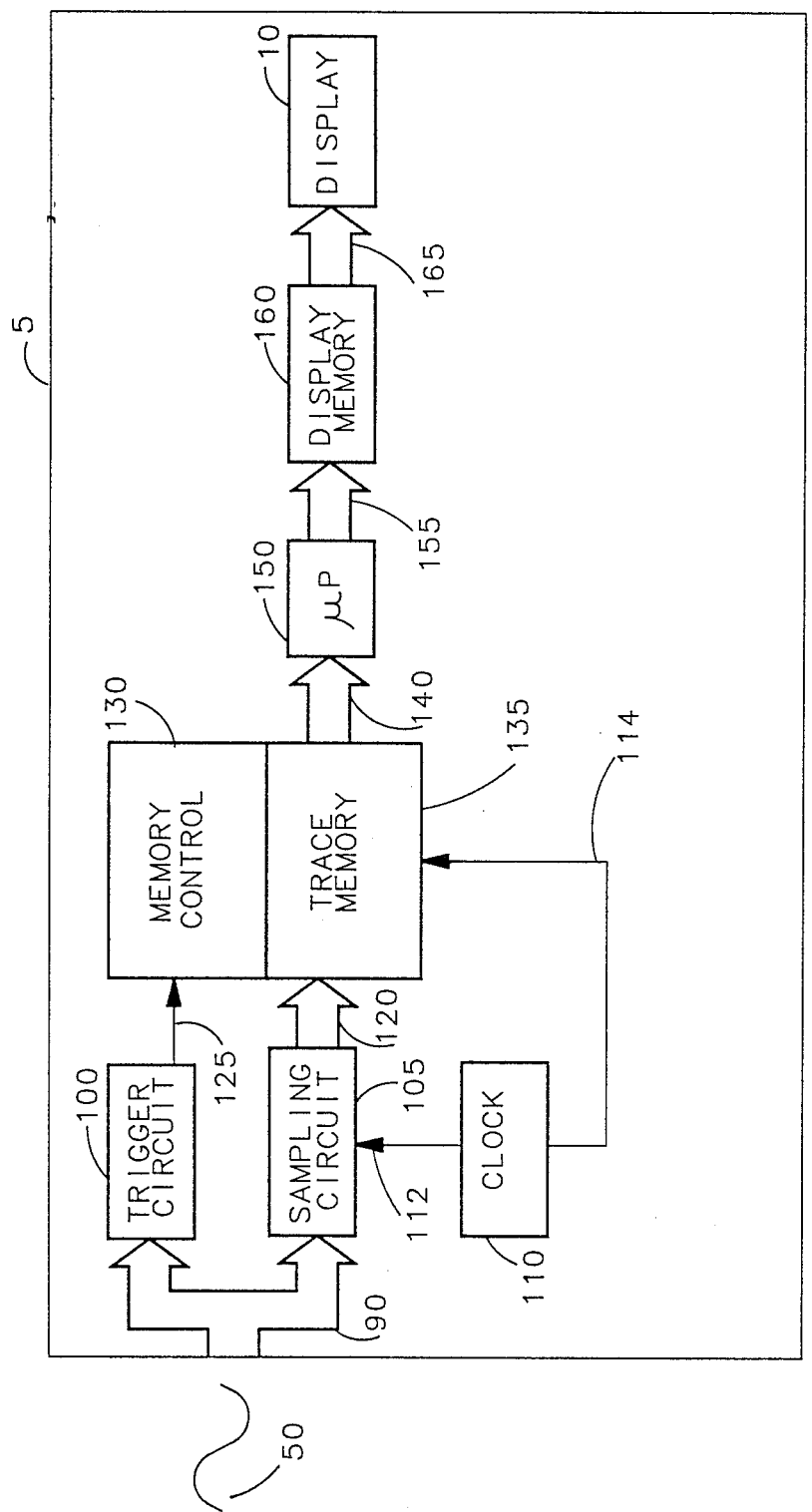
FIG. 3 shows a functional block diagram of a logic analyzer.

FIG. 3 shows a functional block diagram of a logic analyzer, such as logic analyzer 10. A signal, such as signal 50, is input to logic analyzer 10 and applied via bus 90 to trigger circuit 100 and sample 105. (It should be observed that logic analyzer 10 can process multiple input signals in parallel, as suggested by bus 90, but only a single input signal 50 is discussed herein for the sake of explanation of FIG. 3. The functional process which is described herein concerning single signal 50 can occur in parallel if multiple signals are input in parallel.) Sampling circuit 105 digitizes signal 50, that is, it converts signal 50 into 1's and 0's in the manner described in connection with FIG. 2. Sampling circuit 105 samples signal 50 at regular periodic intervals defined by sample clock 110. Clock 110 emits clock signals which activate both sampling circuit 105 and trace memory 135 via lines 112 and 114 respectively. The time length of each interval is known as the sample period. The sample period is user-defined via sample clock 110. The digitized sampling information generated by sampling circuit 105, that is, the 1's and 0's, are stored in trace memory 135 via bus 120. However, trigger circuit 100 defines a trigger condition which input signal 50 must meet before the sampling can begin. Trigger circuit 100 essentially activates logic analyzer 10 in that regard. If the trigger condition is met by input signal 50, trigger circuit 100 emits a signal via line 125 to memory control circuit 130 which allows the sample values that are generated by sampling circuit 105 to be stored in trace memory 135. The digitized sampling information which is stored in trace memory 135 is then read and processed by microprocessor 150 via bus 140, according to predetermined programs. Using the digitized information, microprocessor 150 generates display waveforms which it writes into display memory 160 via bus 155. Display memory 160 is then mapped onto display 15 via bus 165 to produce the square-wave which are visible to the viewer. Collectively, sampling circuit 105, clock 100, trigger circuit 100 and memory control 130 may be referred to as the acquisition hardware of the logic analyzer since these components essentially "acquire" the input signal(s).

Figure 4:
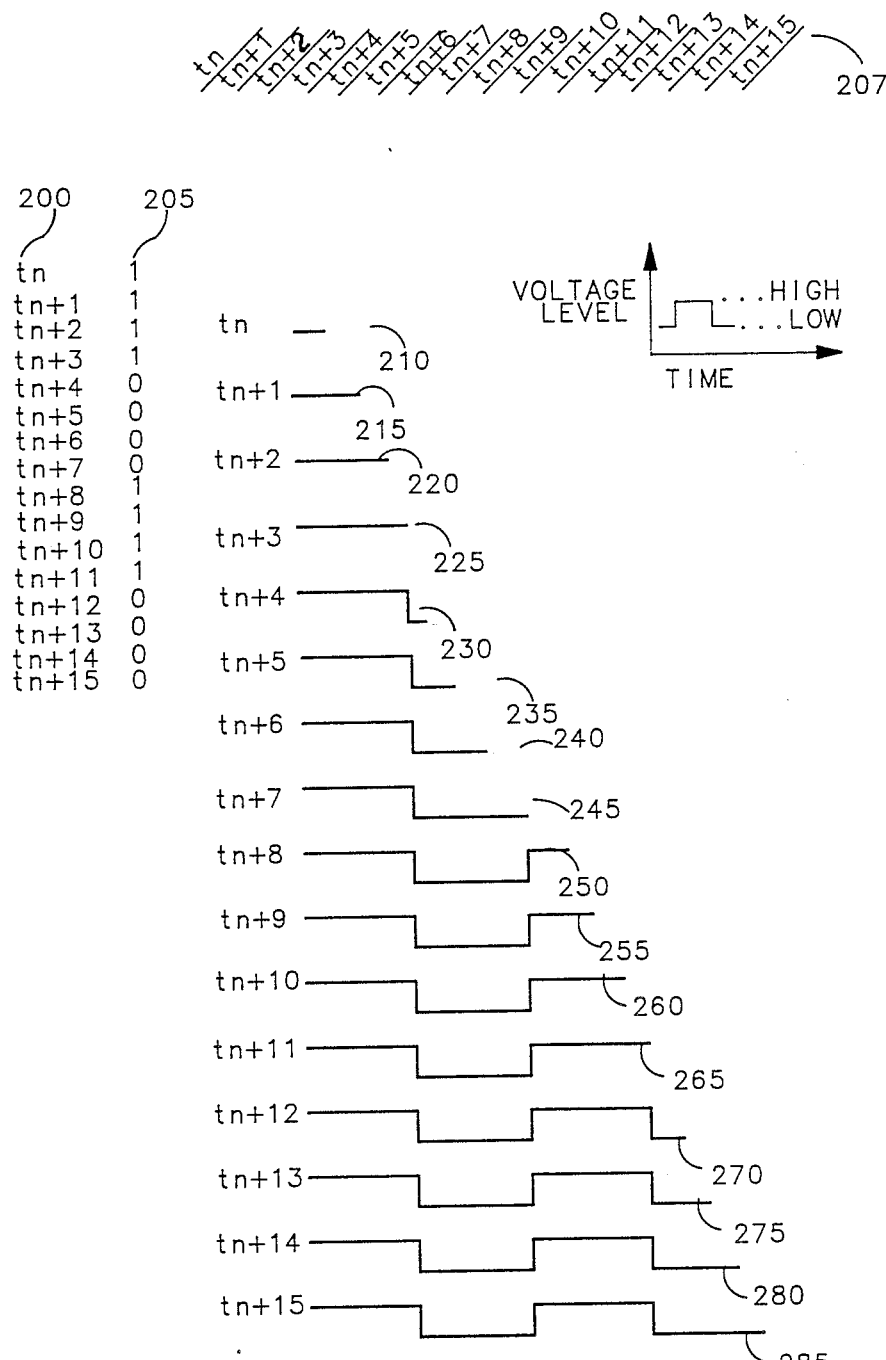
FIG. 4 shows how digitized waveform information for a single waveform is mapped into a single-waveform display.

FIG. 4 shows how digitized waveform information for a single input signal is mapped into a single square-wave waveform display. On the far left in FIG. 4 is a column 200 of sixteen sample-periods marked $t_n$ through $t_{n+15}$. To the right of column 200 is a column 205 of digital values, that is, 1's and 0's, which correspond to the digitized sample values of the input signal for each corresponding sample-period. Thus, for sample period tn the digitized sample value is 1; for sample period $t_{n+5}$ the digitized sample value is 0; for sample period $t_{n+8}$ the digitized sample value is 1, and so forth. Moreover, the sample-periods are numbered chronologically in time such that $t_n$ designates the first sample value acquired, $t_{n+2}$ designates the second sample value acquired, and so forth. In practice, the column 200 of sample-periods, that is, $t_n$ through $t_{n+15}$, is implemented in memory by chronological memory addresses. Thus, FIG. 4 shows a column 200 of sixteen 1-bit memory addresses wherein at each address is the digitized sample value, in column 205, of the input signal for a given sample period. The digitized sample values can be mapped from memory onto a raster display as shown on the left in FIG. 4. Final square-wave waveform 285 represents a direct mapping of the information in memory column 200 onto a raster display screen. The time-units of horizontal time axis 207 of the display screen correspond to the sample periods in memory-address column 200. (In a raster display screen, the time-units 207 would be implemented with pixels such that the number of time-units across the screen equals the number of pixels in a horizontal line across the screen.) The mapping scheme between memory and the display is as follows: given a predetermined correspondence between memory-address column 200 and horizontal time axis 215 of the display, where there are 1's in memory 205, waveform 295 is high in the corresponding time-unit of the display; and where there are 0's in memory 205, waveform 285 is low in the corresponding time-unit of the display. (The predetermined correspondence between the samples in memory and the time-unit on the display in FIG. 4 is one-to-one.) The digitized information in column 205 is mapped onto the display screen in serial order such that the final waveform 285 is drawn onto the display screen, from left to right, in a sequence of segments shown by segmental waveforms 210 through 280.

Figure 5:
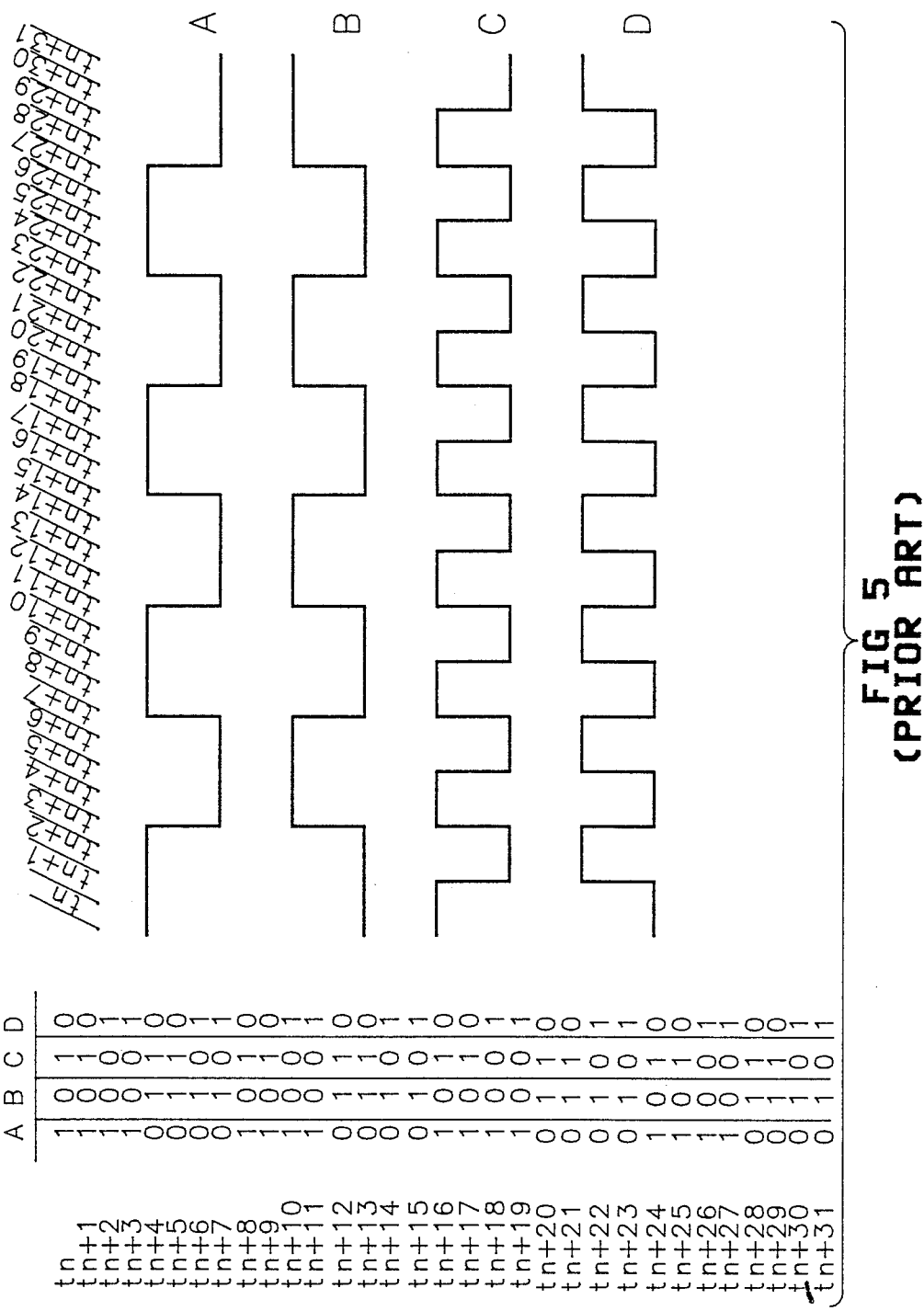
FIG. 5 shows how digitized waveform information for multiple waveforms is mapped into a multiple-waveform display.

FIG. 5 shows how digitized waveform information for multiple waveforms is mapped into a multiple-waveform display. Using the mapping scheme described in connection with FIG. 4, we see in FIG. 5 that the digitized information in column A maps into waveform A; the digitized information in column B maps into waveform B; the digitized information in column C maps into waveform C; and the digitized information in column D maps into waveform D. The waveforms A, B, C and D are simply mapped onto the display screen separately from each other, each starting at a different level on the display screen, using the mapping scheme described in connection with FIG. 4.

Figure 6:
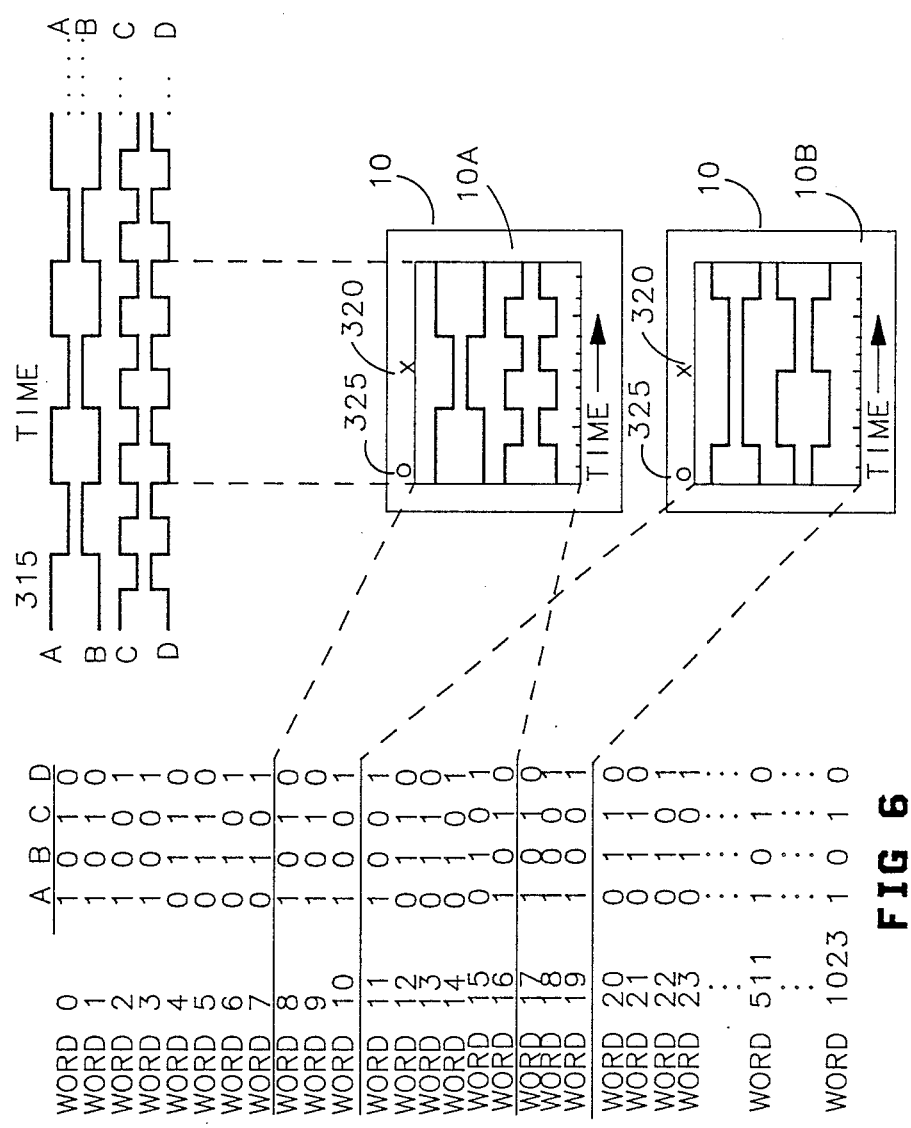
FIG. 6 shows how digitized samples in memory are windowed and magnified using prior art logic analyzer controls. windowed and magnified using the present invention.

FIG. 6 shows how digitized samples in memory are windowed and magnified using prior art logic analyzer controls. In FIG. 6, arbitrary input signals A, B, C and D have been sampled and their digitized sample values stored in trace memory 135. Each word of trace memory 135 contains the digitized samples for signals A, B, C and D acquired in a single user-specified sampling period; trace memory 135 as a whole contains a single trace acquisition. A single trace acquisition fills trace memory 135 with digitized sample values of the input signals following user-specification of the trigger, the hardware-delay time and the location of the trigger in trace memory. (FIG. 6 shows trace memory 135 as a 1023 4-bit word memory structure for the sake of explanation.) Therefore, once the trigger condition is detected and the hardware-delay time has elapsed, the acquisition hardware (sampling circuit 105, clock 110, trigger circuit 100, and memory control 130 of FIG. 3) would fill trace memory 135 with digitized sample values of the input signals. Each word of trace memory 135 therefore holds the digitized samples for a single sample period. Using the start/center/end control of the prior art logic analyzer, the user could specify that the trigger be stored at the start ($word_0$), center ($word_{511}$) or end ($word_{1023}$) trace memory 135. If the trigger was stored at the start, $word_1$ through $word_{1023}$ would hold post-trigger digitized samples; if the trigger was stored at the center, $word_0$ through $word_{510}$ would hold pre-trigger digitized samples through $word_{1023}$ would hold post-trigger digitized samples; if the trigger was stored at the end, $word_0$ through $word_{1022}$ would hold all pre-trigger digitized samples. Suppose the user specified the trigger to ABCD=1010, to be stored at the start of memory and set the hardware-delay equal to one sample-period. In that case, FIG. 6 shows trace memory 135 with the trigger stored in $word_0$ with $word_1$ through $word_{1023}$ having post-trigger information. Digital waveforms corresponding to the digitized samples in trace memory 135 are shown in the top center of FIG. 6. Trigger line 315 is shown at the start of the waveforms. The digital waveforms can be mapped onto display screen 10 as shown in display window 10A. Display window 10A shows a mapping of $word_8$ through $word_{19}$ onto the display screen 10 at a magnification of 1X. The magnification factor for a given mapping is the ratio of sample-periods-in-memory to time-units across the time axis of the display window. Thus, at 1× magnification, one sample period in memory maps into a single time-unit; at 2× magnification, one sample period maps into a two time-units; at 10× magnification, one sample period map into ten time-units and so on. (As noted in connection with FIG. 4, display window time-units can be implemented with pixels in a raster screen such that the number of time-units across the window equals the number of pixels in a horizontal line across the screen.) For the sake of explanation, display window 10A shows twelve time-units. Thus, at a 1× magnification, twelve sample-periods, that is, twelve words from trace memory 135 map into display window 10A. In FIG. 6, $word_8$ through $word_{19}$ map into window for a 1× magnification of the waveforms. Magnify-about markers 325 and 320 allow the user to indicate which portion of display window 10A is to be magnified. Magnify-about marker 325 and 320 may be moved along the horizontal time axis of display window 10A with user-controlled magnify-about marker-movement user controls. The user may specify the degree of magnification (1×, 2×, ..., 10×, etc.) and the marker about which magnification is to occur. For instance, display window 10B shows a 2× magnification of display window 10A about marker 320. Note that since window 10B is a 2× magnification of window 10A, only half as many sample periods in memory, that is, words for trace memory 135, map into display window 10B. Thus, one sample period in memory maps into two time-units of display window 10B to create a 2× magnification of window 10A. (Indirectly, magnification may also be accomplished by decreasing the size of the sample period. However, altering the sample period size would require a new acquisition trace. Thus, for a given acquisition trace in trace memory, magnification is accomplished by increasing the mapping the ratio of time-units to sample periods.)

Figure 7:
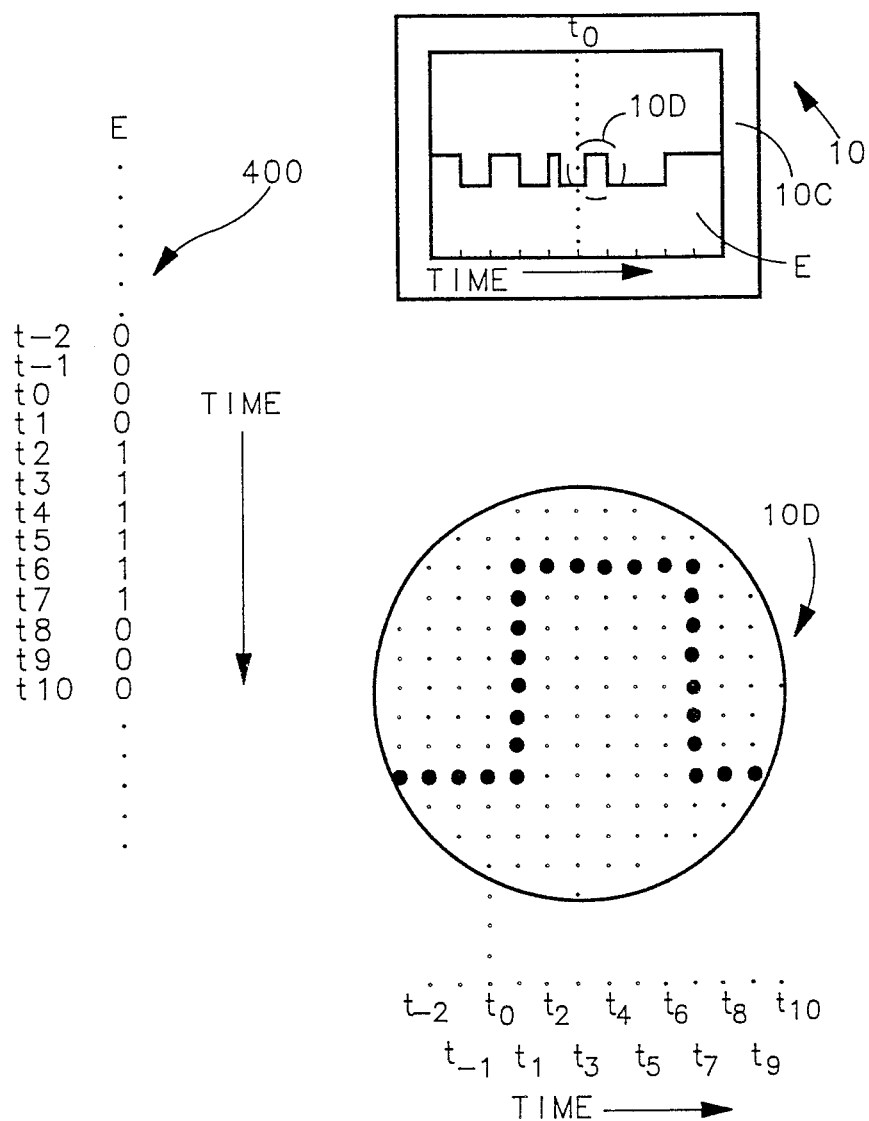
FIG. 7 shows the steps in a method for drawing a waveform on the display window of a logic analyzer using the present invention.

FIG. 7 shows how digitized samples in trace memory can be windowed and magnified using the present invention. Display screen 10 has display window 10C showing an arbitrary digital waveform E whose digitized sample values are in trace memory 400. Window 10C is a raster display implemented with pixels as shown in the blow-up of bubble 10D represents a pixel; each large dot represents an illuminated pixel. In the preferred embodiment of the present invention, digitized sample values in memory column E can be mapped into time-units, that is, pixel columns, of display window 10C using a formula based on user selected values for seconds-per-division and delay. Seconds-per-division is the user-selected amount of time per division along the horizontal time axis of display window 10C. (Display window 10C has ten divisions so that the seconds-per-division value is the range, that is, the total time across the time axis, divided by ten.) Delay is the user-selected time difference between the center of the display window and the trigger. As a reference, the present assigns the trigger condition the time value $t_0$ such that when delay $=0$, then the trigger is mapped into the center of the display window. (For instance, in FIG. 7, the delay is zero since the trigger $t_0$trace memory 400 is mapped into the center of display window 10C.) Thus, increasing delay moves the display window forward in time into post-trigger information (that is, toward the end of the trace memory); likewise, decreasing delay moves the display window backward in time into pre-trigger information (that is, toward the start of trace memory). Given that the trigger is referenced as $t_0$, the trace memory is time scaled such that the digitized samples in trace memory preceding the trigger are referenced as $t_{-1}$, $t_{-2}$, $t_{-3}$, and so on to the start of trace memory; likewise, the digitized samples following the trigger are referenced as $t_1$, $t_2$, $t_3$, and so on to the end of trace memory. The trace memory can then be mapped onto the display window based formula (1) below which assigns each pixel, that is, time-unit, across the display window a time value relative to the time scale of trace memory.

$$Pixel\_Time = [(Pixel\# - Ctrpixel)(Sec/Div) + - (Delay)(Pix/Div)]/[(Pix/Div)(Sec/Sample)]. \quad (1)$$

The variables in formula (I) are defined as follows:

Pixel# is the number of a given pixel in the horizontal row of pixels across the display window. In the preferred embodiment of the present invention, there are 500 pixels across the display window numbered $P_0$ through $P_{499}$.

Ctrpixel is $P_{249}$.

Sec/Div is the user-selected value of seconds-per-division.

Sec/Sample is the sample period. In the preferred embodiment of the present invention, the sample period is acquisition to be the current value of the seconds-per-division setting divided by fifty (although the lowest possible sample-period value is at 10 ns, despite the sec/div setting).

Delay is the user-selected value of delay. In the preferred embodiment of the present invention, if the user selects a delay time less than or equal to 20 ns, then it is presumed that the user is interested primarily in pre-trigger information and therefore the trigger will be stored at the end of trace memory on the following acquisition trace. Likewise, if the user selects a delay greater than 5 ms, then it is presumed that the user is primarily interested in post-trigger information and therefore the trigger will be stored at the start of trace memory on the following acquisition trace. Otherwise, the hardware-delay is set to the user-selected value of delay and the trigger will be stored in trace memory such that the difference between the trigger and the center of trace memory, measured in units of sample periods, is equal to the delay. In addition, if the user specifies a delay which exceeds the sum of the maximum hardware delay time (5 ms in the preferred embodiment) plus the width of the trace memory time scale (where the width of the time scale is the number of sample locations times the sample-period) then the sample-period is automatically increased until the width of the trace memory time scale incorporates that delay. Likewise, if the user specifies a delay which is less than the difference between the minimum hardware-delay time (20 ns in the preferred embodiment) and the width of the trace memory time scale then the sample-period is again automatically increased to incorporate the delay. In the first case the increased sample-period yields greater post-trigger reach, and in the second case the increased sample-period yields greater pre-trigger reach, although in both cases such reach is gained at the expense of resolution.

Pix/Div is the number of pixels across the display window divided by the number of divisions. In the preferred embodiment of the present invention, Pix/Div=50 since there are 500 pixels and ten divisions across the display window.

In the preferred embodiment of the present invention, the $Pixel_{13}Time$ value for each pixel, that is, $P_0$ through $P_{499}$, is calculated and stored in a look-up table at the start of each new acquisition trace. (Alternatively, pixel times could be calculated on the fly as the waveform is being drawn, as opposed to being calculated and stored, but such an alternative is likely to slow down the overall waveform update rate for waveforms having frequent transitions from high-to-low or from low-to-high.) Thus, following each acquisition trace, each pixel in the display window ($P_0$ through $P_{499}$) will have a $Pixel_{13}Time$ which serves to map that pixel into a particular location in the trace memory. (Since formula (1) can generate non-integer number, the present invention uses a rounding rule such that a pixel with a non-integer is mapped into the location in trace memory closest to the non-integer number.) The result is that the logic analyzer user need only manipulate a seconds-per-division and a delay control. The prior art sample-period control is eliminated because sample-period is automatically calculated, at the start of each acquisition trace, to be the user-selected seconds-per-division setting divided by fifty. All of the prior art magnification controls (magnification, magnify-about, and magnify-about marker-movement) are eliminated by the seconds-per-division control: decreasing seconds-per-division increases magnification while increasing seconds-per-division decreases magnification. The prior art start-/center/end control for placement of the trigger in trace memory is eliminated because the present invention automatically positions the trigger as described above. Finally, the hardware-delay is essentially replaced with the present invention's delay control.

Figure 8:
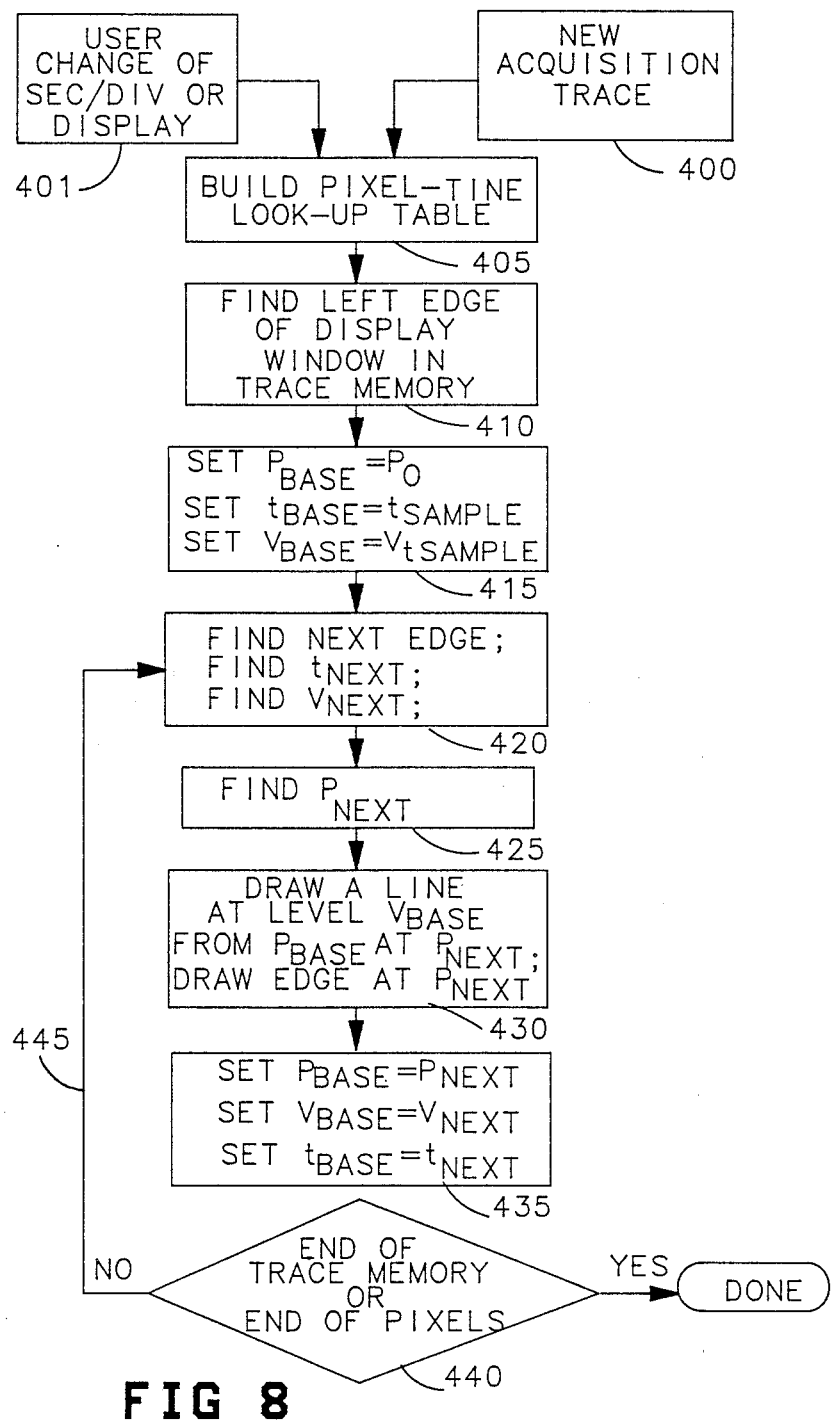

FIG. 8 shows the steps in a method for drawing a waveform on the display window of a logic analyzer using the present invention. The first step 400 is to execute an acquisition trace and fill trace memory 135 of FIG. 1 with digitized samples. An alternate first step 401 is a user change of the seconds-per-division or delay controls. The next step 405 is to calculate $Pixel_{13}Time$ values using formula (1) as discussed above in connection with FIG. 7. In the preferred embodiment of the present invention, there are five hundred pixels across the display window of the logic analyzer such that there are five hundred calculated Pixel-Times indexed $P_0$ through $P_{499}$. The Pixel_Time values for $P_0$ through $P_{499}$ are calculated using the current user-selected values for seconds-per-division and delay and are stored in a look up table. The next step 410 is to find the left edge of the display window of the logic analyzer as that left edge is represented in trace memory. The left edge is identified in trace memory as that digitized sample whose value on the trace memory time scale is less than or equal to the Pixel_{13} Time value of $P_0$. (The trace memory time scale is defined in reference to the location of the trigger ($t_0$) as discussed in connection with FIG. 6. The time value of each digitized sample's location on the trace memory time scale is that location's distance from trigger (measured in samples) times the value of the sample-period.) The next step 415 is to set a counter variable $P_{base}$ equal to the index value of $P_n$. (For instance, if $P_{base}$ gets $P_0$ then $P_{base}$ would contain 0; if $P_{base}$ gets $P_{231}$ then $P_{base}$ would contain 231; and so on.) Also in step 415, a variable $t_{base}$ is set equal to $t_{sample}$, where $t_{sample}$ is the trace memory time-scale value of the location of the digitized sample identified in step 410. In addition in step 415, a variable $V_{base}$ is set equal to $V_{t\_sample}$, where $V_{t\_sample}$ is the logical value (high or low,13 *that is*, 1 or 0) of the contents of the location corresponding to $t_{sample}$. In the next step 420, the next vertical transition edge of the waveform is found by stepping forward in trace memory until the next location having a sample value different from the current location's value is identified. The variable $t_{next}$ is assigned the trace memory time scale value of that next location. The variable $V_{next}$ is assigned the logical value (high or low, that is, 1 or 0) of the sample in that location. The next step 425 is to find the pixel $P_{next}$ whose Pixel_{13} Time value in the Pixel_Time look-up table is closest to $t_{next}$. Given identification of $P_{next}$, a horizontal line (corresponding to the logical level of $V_{base}$) is drawn on the display window from pixel $P_{base}$ to pixel $P_{next}$ in step 430. A vertical transition edge is also drawn at pixel $P_{next}$ in step 430. In the next step 435, the variables $P_{base}$, $V_{base}$ and $t_{base}$ are updated to $P_{next}$, $V_{next}$ and $t_{next}$, respectively. In the next step 440, a test is made to check for the end of trace memory and/or the right-hand edge of the display window. If either test is true, then the waveform is complete; otherwise the method reiterates beginning at step 420 as indicated by loop 445. Note that a single acquisition trace, as executed in step 400, can load trace memory with information for multiple waveforms. Therefore, additional waveforms from the one acquisition trace executed in step 400 can be drawn by re-executing steps 410 through 445 for each additional waveform. Note also that step 405 only has to be executed once for each acquisition trace of step 400 or change in seconds-per-division or delay controls in step 401.

Figure 9A:
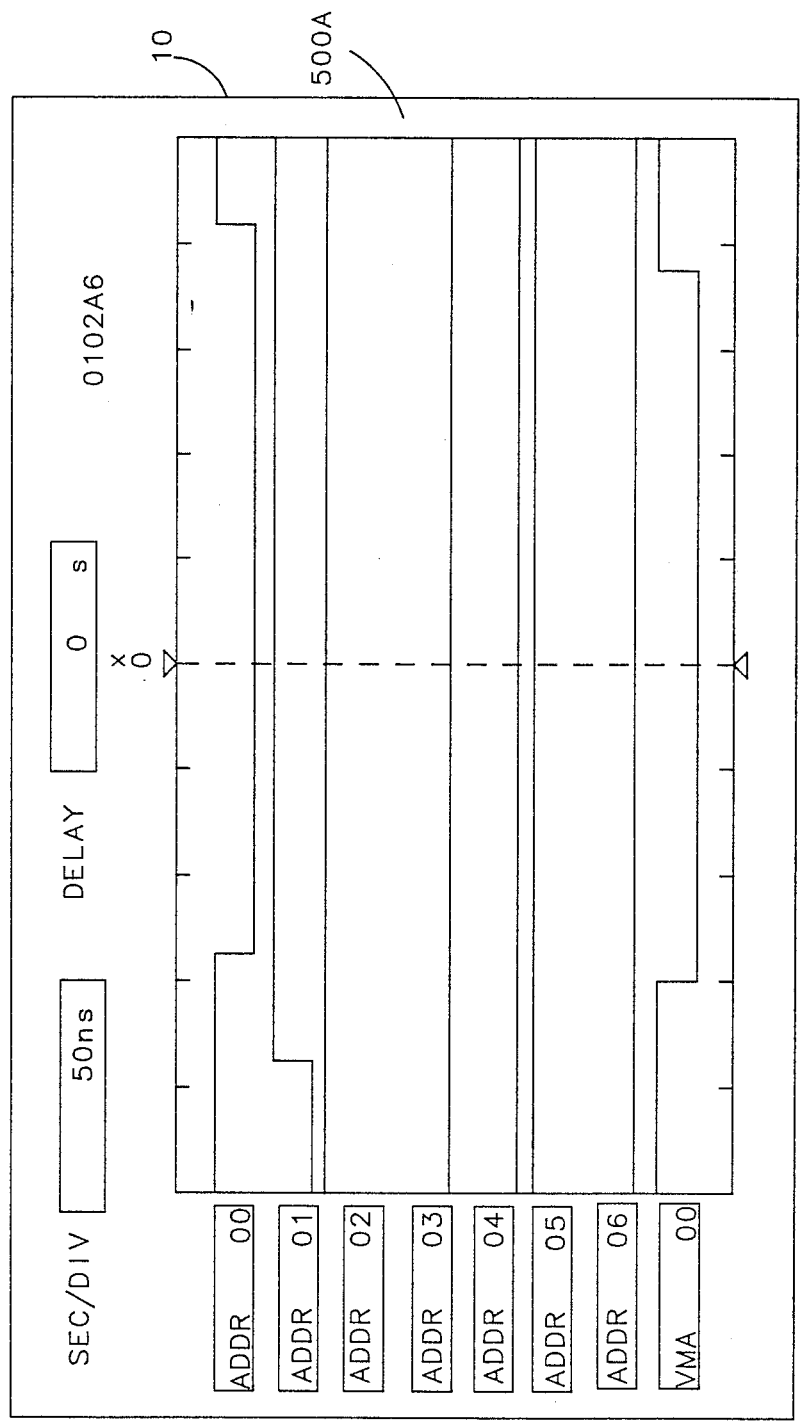
FIGS. 9A through 9D show how the present invention's seconds-per-division control/effects the display window of a logic analyzer.
Figure 9B:
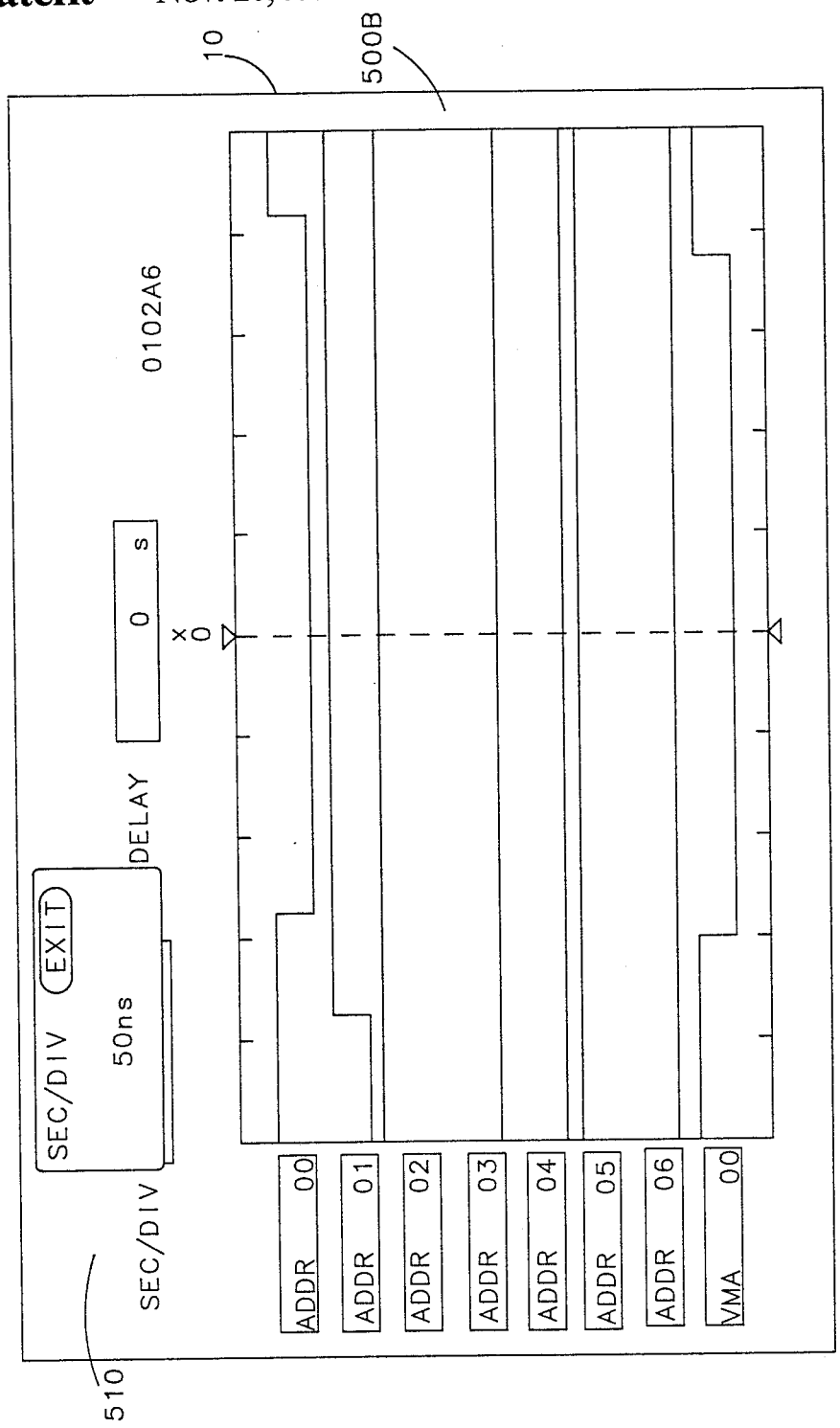
Figure 9C:
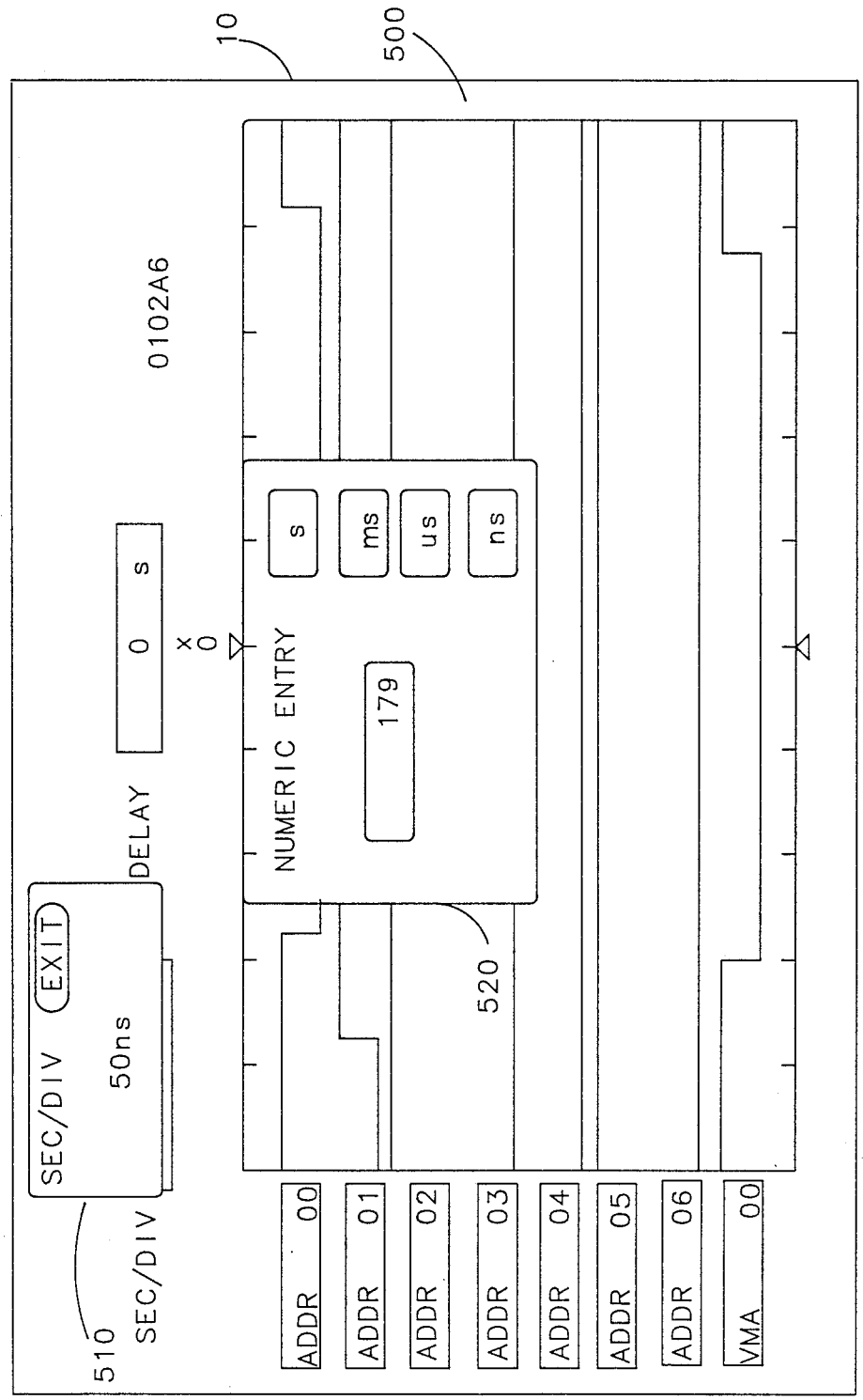
Figure 9D:
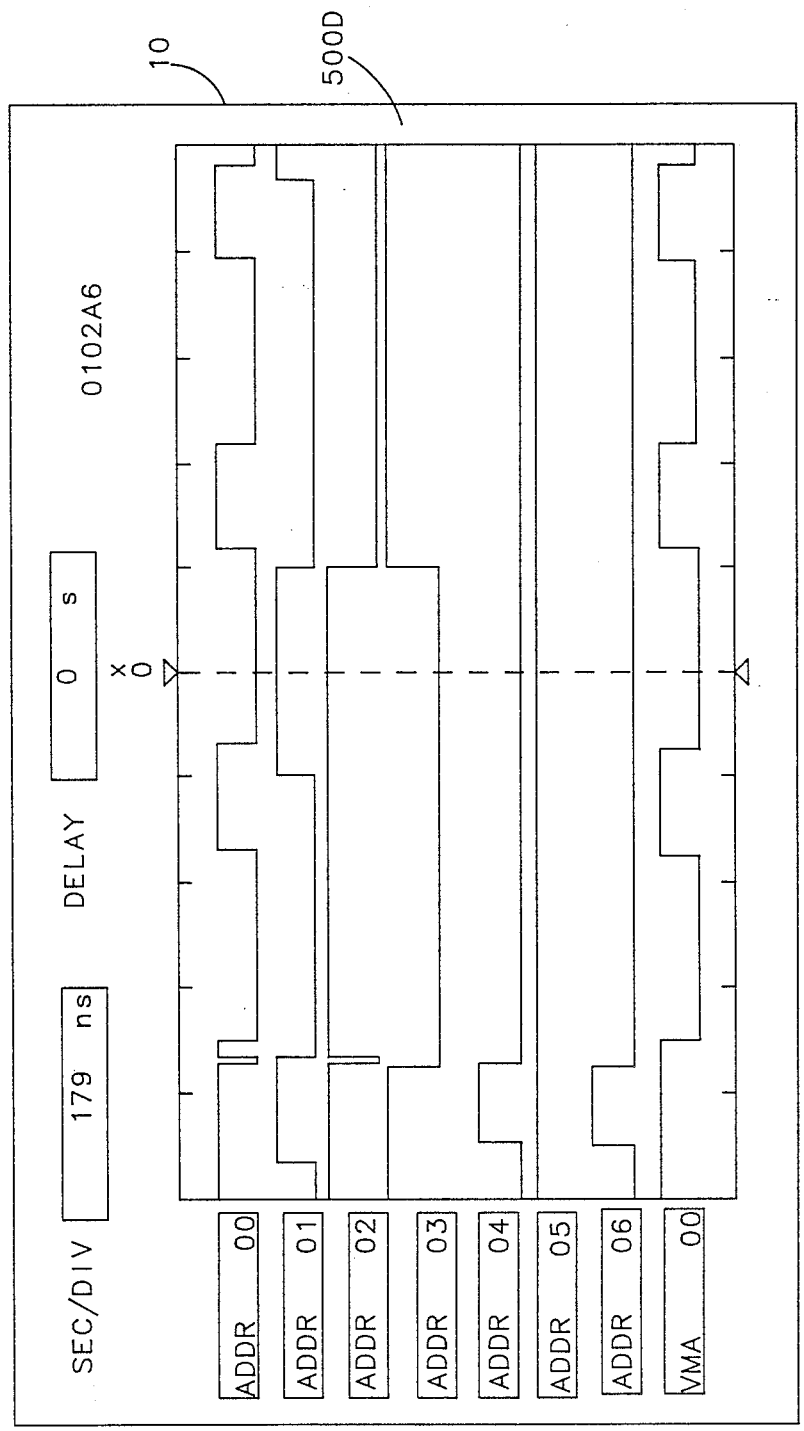

FIGS. 9A through 9D show how the present invention's seconds-per-division control effects the display window of a logic analyzer. FIG. 9A shows display window 500A showing the acquisition trace waveforms for seven address signals (ADDR 00 through ADDR 06) and one control signal (VMA 00). In FIG. 9A, the seconds-per-division setting is 50 ns as shown in the sec/div window. (The delay setting is 0s as shown in the delay window.) In FIG. 9B, user-controlled seconds-per-division selection window 510 is shown having the current value of sec/div (50 ns). The values in window 510 may be changed by rolling control knob 25 of FIG. 1. (The sec/div values change in the standard 1-2-5 sequence available on most oscilloscopes.) In FIG. 9C, user-controlled numeric entry window 520 is shown whereby the user may enter a new sec/div setting (179ns). (Note in FIG. 9D that the user is able to enter sec/div values outside the 1-2-5 sequence which constrains most oscilloscopes. For instance, the value 179 ns was entered using numeric punch keys.) In FIG. 9D, display window 500D is shown having new sec/div setting 179 ns. A comparison of FIG. 9D with FIG. 9A shows that the smaller sec/div setting in FIG. 9A (50ns) is a magnification of the display in FIG. 9D (179 ns).

Figure 10A:
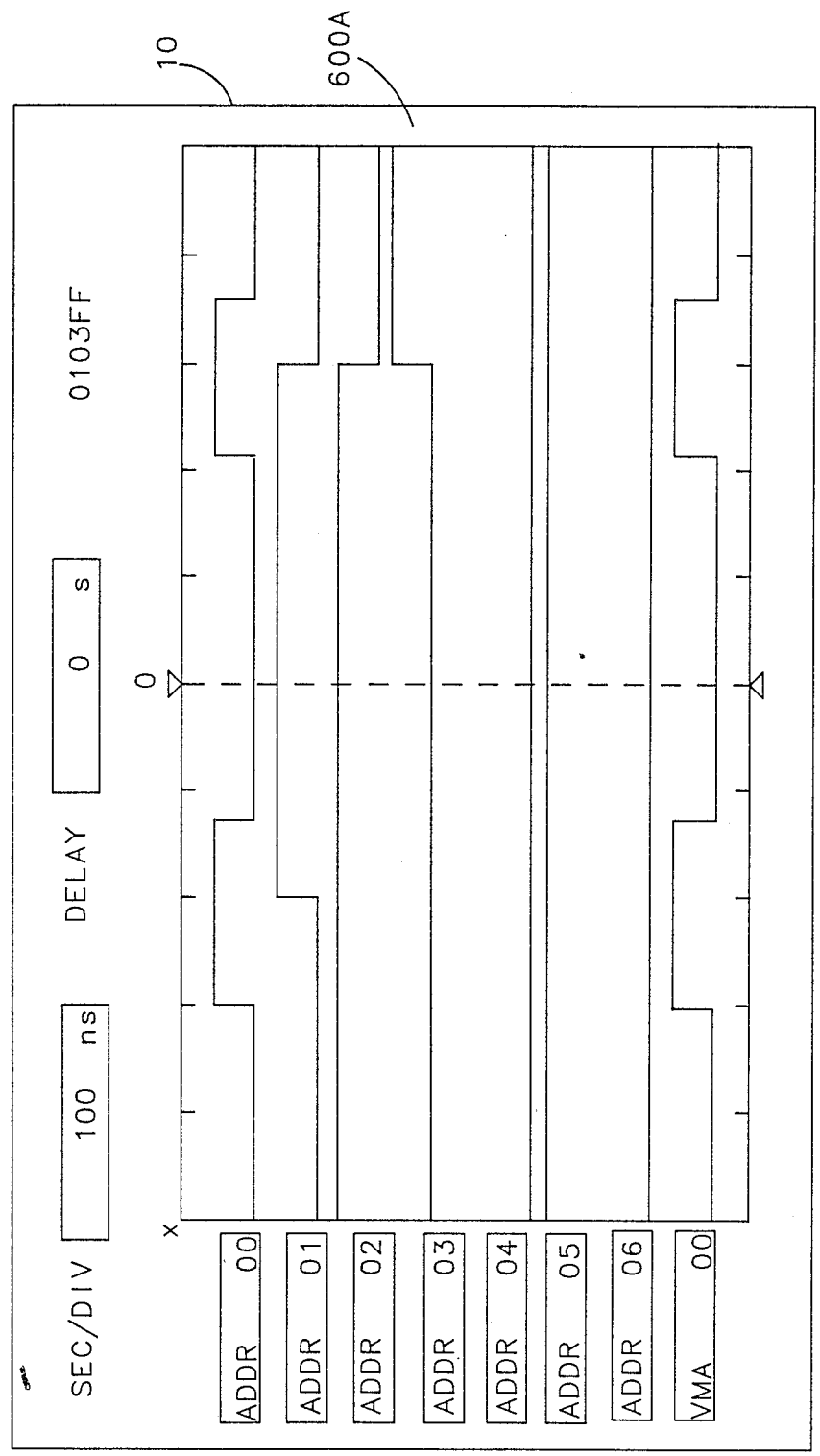
FIG. 10A through 10D show how the present invention's delay control effects the display window of a logic analyzer.
Figure 10B:
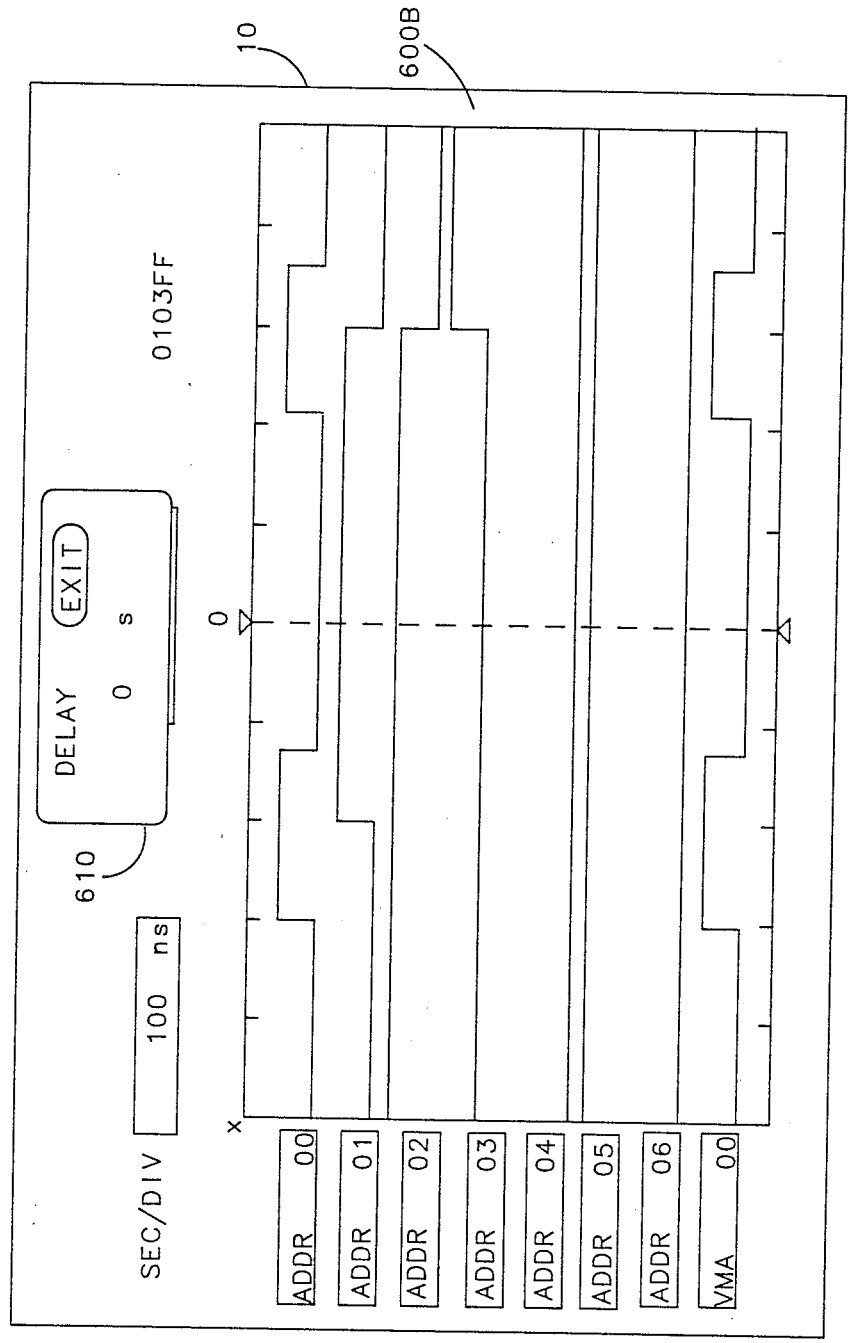
Figure 10D:
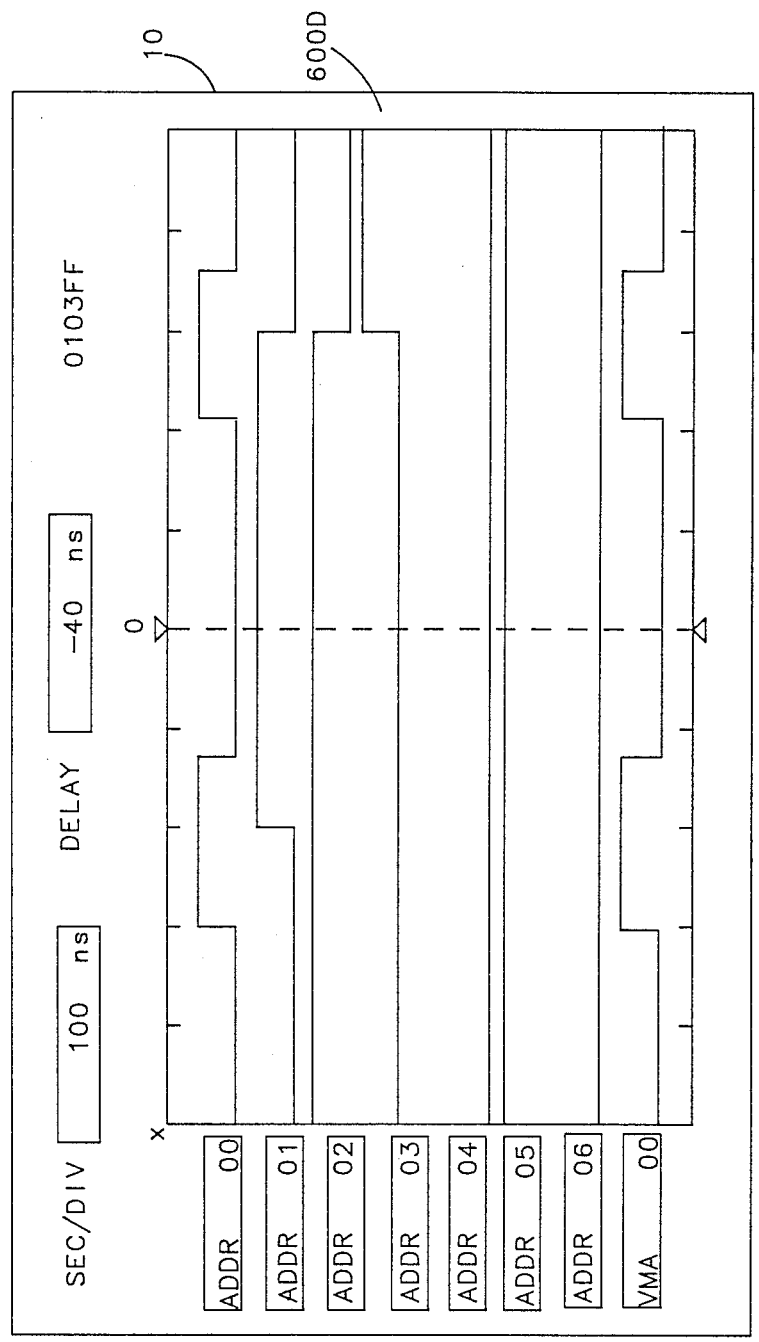
Figure 10C:
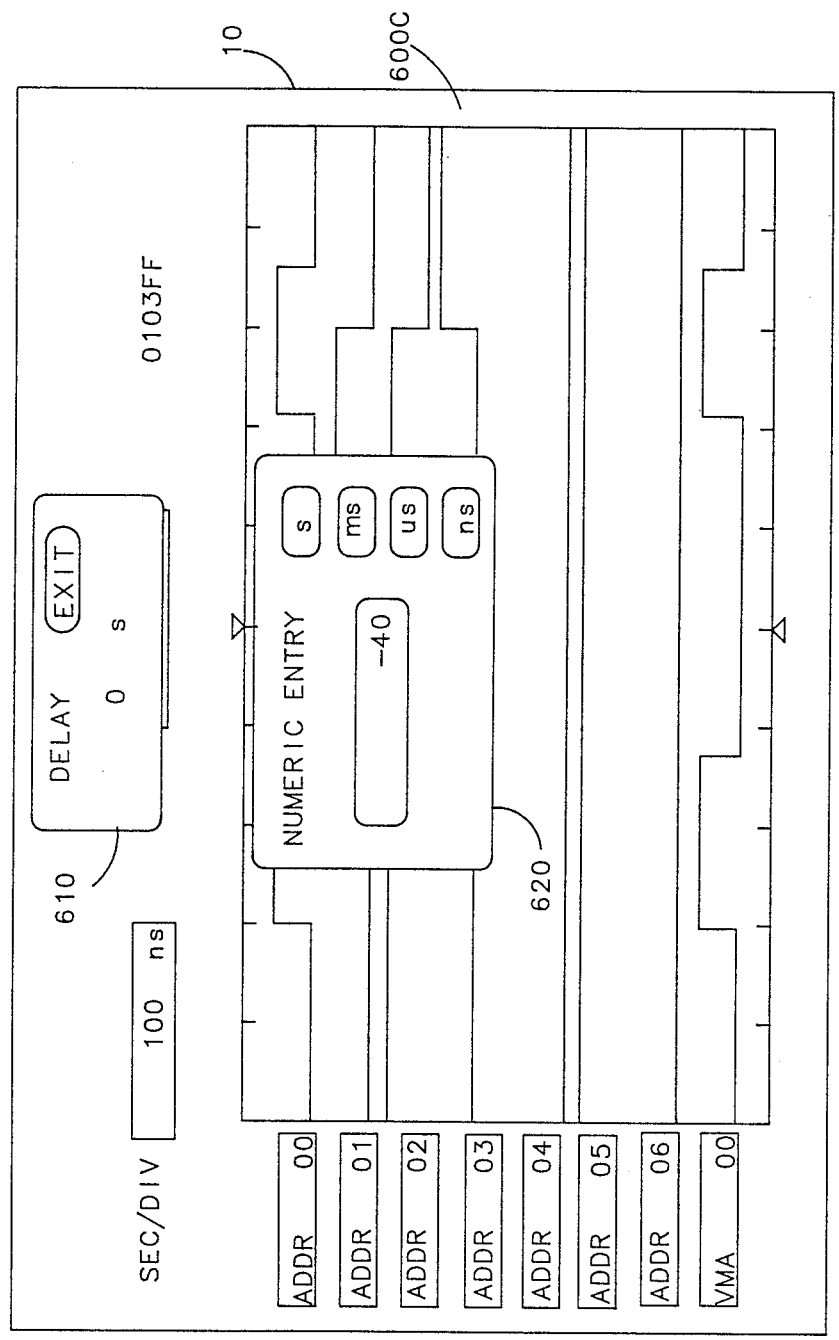

FIGS. 10A through 10D show how the present invention's delay control effects the display window of a logic analyzer. FIG. 10A shows display window 600A showing the acquisition trace waveforms for seven address signals (ADDR 00 through ADDR 06) and one control signal (VMA 00). In FIG. 10A, the delay setting is 0s, as shown in the display window. (The seconds-per-division setting is 50 ns as shown in the sec/div window.) In FIG. 10B, user-controlled delay selection window 610 is shown having the current value of the delay setting (0s). The user may enter new values for delay in window 610 by turning control knob 25 of FIG. 1. In FIG. 10C, user-controlled numeric entry window 620 is shown whereby the user may enter a new delay setting ($-40$ ns) using numeric punch keys. In FIG. 9D, display window 600D is shown is shown having new delay setting $-40$ ns. A comparison of FIG. 10D with FIG. 10A shows that window 600D is shifted 40 ns to the left of window 600A.

I claim:

1. A user-interface for a logic analyzer, the user interface having an oscilloscope-like knob, said knob being controllable by the user for continuously adjusting variables on a scale, the user-interface being part of the logic analyzer, said logic analyzer having a waveform display window and a waveform trace memory, said user-interface comprising:

a seconds-per-division control, being part of the logic analyzer, such that through direct access using the knob, the user can continuously adjust and control magnification of the waveform display window of the logic analyzer solely by altering the seconds-per-division control such that increasing the ratio of seconds-per-division decreases magnification and decreasing said ratio increases magnification; and a delay control, being part of the logic analyzer such that through direct access using the knob, the user can control the position of the waveform display window of the logic analyzer relative to the waveform trace memory of the logic analyzer solely by altering the delay control.

2. A user-interface for a logic analyzer, the user-interface being part of the logic analyzer, said logic analyzer having a waveform display window and a waveform trace memory, said user-interface having an oscilloscope-like user control which makes said analyzer operable like an oscilloscope, said user-interface comprising:

a seconds-per-division control, being part of the logic analyzer, such that through direct access by the user control, the user can continuously adjust and control magnification of the waveform display window of the logic analyzer solely by altering the seconds-per-division control such that increasing the ratio of seconds-per-division decreases magnification and decreasing said ratio increases magnification; and a delay control being part of the logic analyzer such that through direct access by the user control, the user can control the position of the waveform display window of the logic analyzer relative to the waveform trace memory of the logic analyzer solely by altering the delay control.

* * * * *